United States Patent
Armacost et al.

[11] Patent Number: 6,051,504
[45] Date of Patent: Apr. 18, 2000

[54] ANISOTROPIC AND SELECTIVE NITRIDE ETCH PROCESS FOR HIGH ASPECT RATIO FEATURES IN HIGH DENSITY PLASMA

[75] Inventors: Michael David Armacost, Wallkill; Richard Stephen Wise, Beacon, both of N.Y.

[73] Assignee: International Business Machines Corporation, Armonk, N.Y.

[21] Appl. No.: 08/912,216

[22] Filed: Aug. 15, 1997

[51] Int. Cl.$^7$ .................................................. H01L 21/302
[52] U.S. Cl. .......................... 438/706; 438/724; 438/744; 438/749
[58] Field of Search ..................... 438/706, 724, 438/744, 723, 626, 627, 632, 242, 246, 270, 273, 281, 749

[56] References Cited

U.S. PATENT DOCUMENTS

| | | | |
|---|---|---|---|
| 4,511,430 | 4/1985 | Chen et al. | 156/643 |
| 4,774,198 | 9/1988 | Contiero et al. | 438/273 |
| 4,857,140 | 8/1989 | Loewenstein | 156/643 |
| 4,978,420 | 12/1990 | Bach | 156/643 |
| 5,102,817 | 4/1992 | Chatterjee et al. | 438/270 |
| 5,201,993 | 4/1993 | Langley | 156/643 |
| 5,201,994 | 4/1993 | Nonaka et al. | 156/643 |
| 5,286,344 | 2/1994 | Blalock et al. | 156/687 |
| 5,302,535 | 4/1994 | Imai et al. | 437/31 |
| 5,310,454 | 5/1994 | Ohiwa et al. | 156/643 |
| 5,491,099 | 2/1996 | Hsu | 438/305 |
| 5,610,099 | 3/1997 | Stevens et al. | 437/192 |

FOREIGN PATENT DOCUMENTS

| | | |
|---|---|---|
| 0 651 434 | 5/1995 | European Pat. Off. . |
| 6-267907 | 9/1994 | Japan . |
| 7-161702 | 6/1995 | Japan . |

*Primary Examiner*—David Nelms
*Assistant Examiner*—Reneé R. Berry
*Attorney, Agent, or Firm*—Ratner & Prestia; Steven Capella

[57] ABSTRACT

A process for etching silicon nitride from a multilayer structure which uses an etchant gas including a fluorocarbon gas, a hydrogen source, and a weak oxidant. A power source, such as an RF power source, is applied to the structure to control the directionality of the high density plasma formed by exciting the etchant gas. The power source that controls the directionality of the plasma is decoupled from the power source used to excite the etchant gas. The fluorocarbon gas is selected from $CF_4$, $C_2F_6$, and $C_3F_8$; the hydrogen source is selected from $CH_2F_2$, $CH_3F$, and $H_2$; and the weak oxidant is selected from $CO$, $CO_2$, and $O_2$.

15 Claims, 2 Drawing Sheets

ANISOTROPIC AND SELECTIVE NITRIDE ETCH PROCESS FOR HIGH ASPECT RATIO FEATURES IN HIGH DENSITY PLASMA

FIELD OF THE INVENTION

The present invention relates in general to a method of manufacturing integrated circuits and other electronic devices. In particular, the present invention describes a process for the etching of silicon nitride on a semiconductor wafer or other multilayer structure.

BACKGROUND OF THE INVENTION

In semiconductor fabrication, it is often desirable to anisotropically etch thick dielectric films with high aspect ratio features (e.g., 4:1 or greater) without excessive erosion of an accompanying photoresist. The application of a low pressure, high ion flux process (e.g., a high density plasma source) is advantageous to avoid aspect ratio dependent etching (ARDE) and across chip line variation (ACLV) effects. High density plasmas, such as from an inductively coupled source, operate at lower pressures due to electron acceleration normal to chamber boundaries and provide for increased ion density and flux.

By exciting the plasma with a solenoidal coil structure, the electron mean free path can be made larger than the chamber dimensions and hence the operating pressure can be lower and the fractional ionization higher than in traditional capacitive (or parallel plate) etch chambers. Both of these properties yield reduced ARDE and ACLV.

These advantages have been demonstrated for high density plasma etching of silicon oxide for feature sizes as small as 0.175 $\mu$m. Many levels used in modern semiconductor devices, however, consist of both silicon oxide and silicon nitride layers, or a silicon nitride layer alone. In hardmask applications, a thick nitride layer exists, either alone or with a thick oxide layer, and cannot be etched in a high density plasma using present state-of-the-art technology due to poor photoresist selectivity and subsequent loss of image integrity. The high dissociation level in high density plasma reactors often leads to isotropic etching by fluorine atoms in fluorocarbon gases.

To avoid these drawbacks, capacitively coupled tools are used to etch thick nitride or nitride/oxide layers such as hardmask. These tools suffer from severe reactive ion etching (RIE) lag as the feature size is decreased, and raw process time (RPT) increases substantially. In addition, selectivity to photoresist is compromised when a reduced polymer concentration is used in these tools, while increasing the polymer concentration results in premature etch stop as the feature sizes are further decreased.

Nonetheless, there are several advantages in using high density plasma. For example, the ion energy is highly tunable in high density plasma because the wafer bias is independently controlled, thereby providing improved control of resist loss. For this reason, a selective nitride etch of high aspect ratio features in high density plasma is desirable. To date, selective high density plasma etching for high aspect ratio silicon nitride levels has remained elusive.

Current state-of-the-art for high density plasma nitride etching in high aspect ratio holes includes mixtures of either $CH_3F/CO$ (SRDC) or $C_2F_6/O_2$ (BTV). Neither of these systems provides enough selectivity to photoresist for etching of nitride layers greater than 500 Å thick. At aspect ratios greater than 2:1 (0.35 $\mu$m groundrules), the $CH_3F/CO$ chemistry suffers from etch stop. $C_2F_6/O_2$ chemistry has less than 1:1 selectivity even for shallow features.

FIG. 1 illustrates the use of an oxygen free polymerizing process ($C_2F_6/CH_3F$), which exhibits nitride etch rates of 3500 Å min$^{-1}$ on blanket nitride layer 10 through an oxide or photoresist 20. Blanket nitride layer 10 is formed over a silicon substrate 15. The etch profile is isotropic, however, and an undesirable undercut 30 exists at the nitride/oxide or nitride/photoresist interface 35.

Although the art of etching silicon nitride is well developed, some problems inherent in this technology still exist. One particular problem is etching for high aspect ratio silicon nitride levels. Therefore, a need exists for a process for etching silicon nitride with a high aspect ratio while maintaining photoresist selectivity and avoiding subsequent loss of image integrity.

SUMMARY OF THE INVENTION

In the present invention, a method for anisotropically etching a silicon nitride layer from a multilayer structure comprises the steps of: exciting an etchant gas comprising a fluorocarbon gas, a hydrogen source, and a weak oxidant to form a high density plasma including the excited etchant gas; applying a power source to the structure to control the directionality of the high density plasma on the structure; and introducing the high density plasma to the silicon nitride layer to etch the silicon nitride layer.

In the present invention, the fluorocarbon gas is selected from the group consisting of $CF_4$, $C_2F_6$, and $C_3F_8$; the hydrogen source is selected from the group consisting of $CH_2F_2$, $CH_3F$, and $H_2$; and the weak oxidant is selected from the group consisting of CO, $CO_2$, and $O_2$.

Another embodiment of the etchant gas within the scope of this invention includes adding the fluorocarbon gas in an amount of about 4–20% by volume; adding the hydrogen source in an amount about 10–30% by volume; and adding the weak oxidant in an amount of about 40–70% by volume.

According to another embodiment of the present invention, the power source used to control the directionality of the plasma, such as an RF power source, is decoupled from the power source used to excite the etchant gas, such as a coil. Preferably, an RF power source is applied to the side of the structure opposite the side having the silicon nitride layer being etched.

According to another embodiment of the invention, the etchant gas is introduced into a chamber, the pressure of which is preferably maintained at 1 to 20 millitorrs. The etchant gas is then excited by exposing the gas to a first power source to form a high density plasma. This embodiment includes controlling the bias of the plasma on the structure by applying a second power source, decoupled from the first power source, to the structure. The plasma is introduced to the silicon nitride layer to etch a feature in the silicon nitride layer having an aspect ratio of at least 2:1, and preferably at least 6:1.

The foregoing and other aspects of the present invention will become apparent from the following detailed description of the invention when considered in conjunction with the accompanying drawing.

DETAILED DESCRIPTION OF THE INVENTION

The present invention provides a nitride etch that has increased selectivity to photoresist and provides tunable anisotropy. A dry etch process is described which enables a more efficient nitride etch. The preferential etchant gas is a mixture of $C_2F_6$, $CH_3F$, and CO. The present invention allows for anisotropic and rapid etching in high aspect ratio features for semiconductor devices such as dynamic random access memories (DRAMs). The gas mixture of the present invention has a high selectivity to photoresist. Fine control of the taper angle of the nitride etch is achieved. Additional control is provided through independent control of the source/bias power.

The present invention uses a fluorocarbon polymer precursor species that results in the formation of a passivation layer, so that the etch is anisotropic. The present invention also uses an oxygen-containing species to aid in removal of the passivation layer by ion enhanced etching in the vertical direction. The addition of oxygen reduces photoresist selectivity, because the photoresist does not suffer from microloading as does the nitride in the feature. By increasing the polymer content to preserve resist, etch stop occurs more readily in the high aspect ratio feature.

Figure 2B:
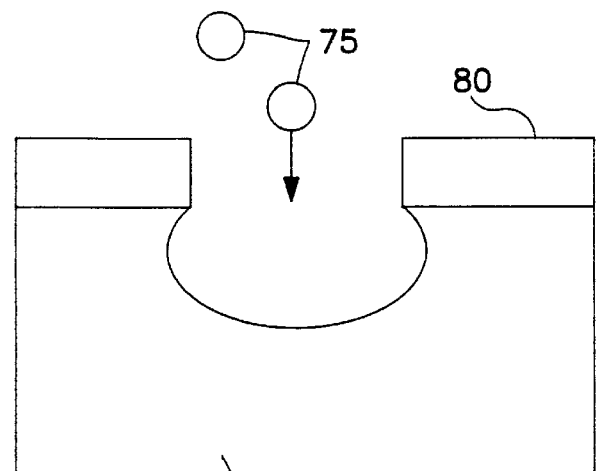
FIG. 2B shows a profile of a nitride etched using a convention process with an unbiased substrate.
Figure 2A:
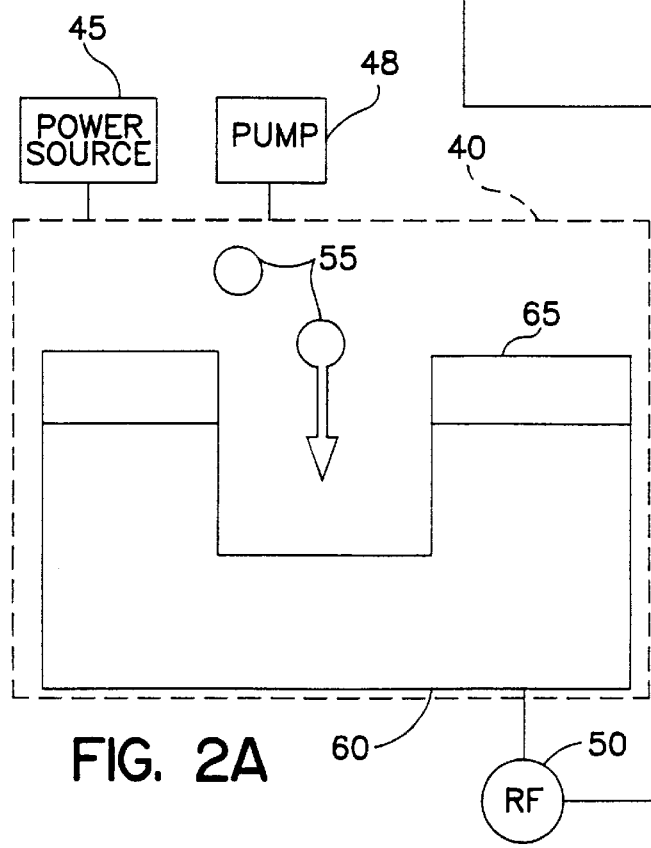
FIG. 2A shows a profile of a nitride etched using a biased substrate according to the present invention.

According to the present invention, the power source used to control the directionality of the plasma is decoupled from the power source used to excite the etchant gas to form the high density plasma. Thus, a decoupled power source incorporates independent control of bias on the wafer from the plasma generation mechanism. The term "decoupled" is used because the ion bombardment energy is primarily controlled by the bias to the wafer, whereas the ion flux (and density) is primarily controlled by the power applied to the generating structure (e.g., coils in an inductive plasma source). This structure is shown in FIG. 2A, in which the etchant gas is introduced to a chamber 40 (shown in dashed lines), and the etchant gas is excited by a first power source 45 to form a high density plasma having ions 55. A second power source, such as RF power source 50, is decoupled from first power source 45. Preferably, the pressure of chamber 40 is maintained at about 1 to 20 millitorrs by utilizing a vacuum pump 48 which is coupled to chamber 40.

A biased substrate, such as that used by the decoupled plasma source, oscillates the potential of the wafer platen, typically by several thousand volts. Although a certain fraction of this potential is shielded by the plasma electrons (sheath capacitance) and wafer/chuck capacitance, the acceleration of the ions striking the wafer is much larger, typically an acceleration corresponding to 50 to 500 V. This additional energy accelerates etching in a direction normal to the wafer surface, and is responsible for the anisotropic etching in the present invention. In a biased substrate, as shown in FIG. 2A, RF power source 50 is applied to the back of a substrate 60, namely the side of substrate 60 opposite the layer being etched (such as a silicon nitride layer). In FIG. 2A, substrate 60 could represent a silicon nitride layer formed over a silicon substrate. RF power source 50 accelerates ions 55 towards the substrate 60, thereby increasing the etch rate in that direction. The pattern on photoresist 65 is transferred directly to the underlying layers, thus maximizing packing density. In an unbiased substrate 70, as shown in FIG. 2B, ions 75 are not accelerated towards the substrate 70, so etching proceeds in every direction, undercutting the photoresist 80, and limiting the packing density of the devices. Substrate 70 could represent a silicon nitride layer formed over a silicon substrate.

A high density plasma refers to the charged particle density in the plasma. In a conventional or typical density plasma, the ion density is typically less than about $10^{11}$ $cm^{-3}$, whereas in a high density source the fractional ionization is above $10^{11}$ $cm^{-3}$. High density plasma sources accelerate the plasma electrons in a direction normal to reactor boundaries, so that the electron mean free path is long compared to the plasma dimensions. This allows for a lower operating pressure, but also requires a higher degree of ionization to sustain the plasma with the higher ion wall flux.

The process of the present invention provides selective anisotropic nitride etching in a high density plasma, with rates of 100 Å $s^{-1}$ or better (determined by required selectivity) in aspect ratios higher than 6:1. Similar etching of nitride in a conventional capacitively coupled tool exhibit reactive ion etching (RIE) lag, as described above, and nitride etch rates on the order of about 12.5 Å $s^{-1}$ are obtained.

Figure 1:
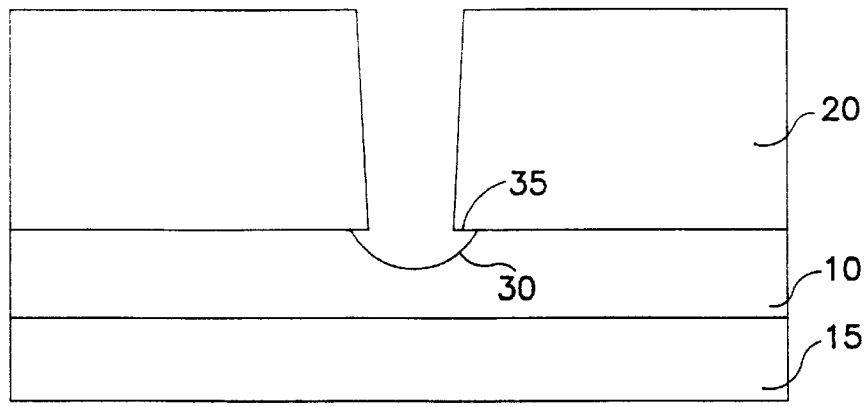
FIG. 1 shows a profile of a nitride etched using a conventional process.

In an exemplary embodiment of the present invention, a weak oxidant, preferably CO or $CO_2$, is added to the polymerizing system described above with respect to FIG. 1, $C_2F_6/CH_3F$. As used herein, a "weak oxidant" refers to a compound that will readily react with a fluorocarbon to form a product (such as a $COF_x$ compound) which is more volatile than the original fluorocarbon. More preferably, a weak oxidant is a compound which forms a $COF_x$ product more volatile than the original fluorocarbon at operating conditions, such as at temperatures of less than 200° C. at 1–20 millitorrs. The oxidant addition assists in removal of the passivation layer and switches the gas phase plasma chemistry C/F ratio to lower values, thereby further enhancing etch rate and decreasing passivation polymer. The results are shown in FIG. 3.

Figure 3:
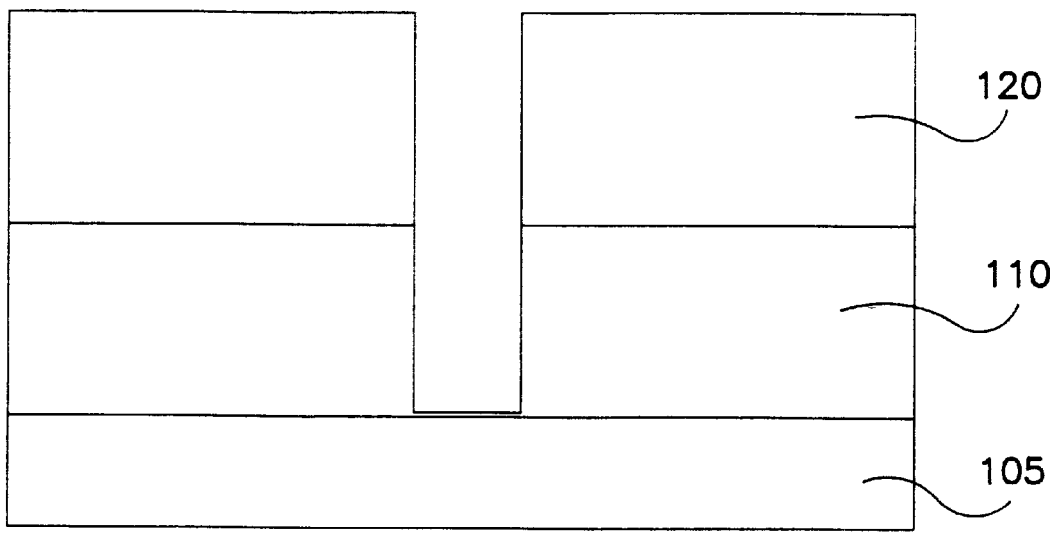
FIG. 3 shows a profile of a nitride etched using an exemplary process in accordance with the present invention.

FIG. 3 shows an etch profile that is close to ideal, with the etch rate being approximately 100 Å $s^{-1}$. The nitride layer 110 has been etched with nearly vertical sidewalls, and the oxide or photoresist overlayer 120 is not undercut. The nitride layer 110 is formed over a silicon substrate 105. Although the feature as shown is etched to the nitride layer/substrate interface, the feature may be etched to slightly above or below the interface, depending on the particular needs. The $CH_3F$ acts as a hydrogen source, and enhances chemical etching of nitride (suggested by increasing isotropy) and improves photoresist selectivity (by both polymerization and fluorine scavenging). The $C_2F_6$ decreases undercut and controls taper of the nitride because of its role as a downhole supplier of $CF_x$ polymer precursors. The preferred chamber used to obtain the profile in FIG. 3 is an Applied Materials Omega Chamber (ASTC Hex 248) and the preferred gas mixture is $C_2F_6$, $CH_3F$, CO. It is within the scope of the invention that any similar chamber containing the gas mixture $C_2F_6$, $CH_3F$, CO will produce the desired results. The pressure of the chamber is preferably in the range between about 1 and 20 millitorrs.

Reducing both $CH_3F$ and CO from the above conditions yield similar profiles (not shown) because the loss of the passivation agent ($CH_3F$) is balanced by reduction of the oxidizer (CO). For example a mixture of 10 standard cubic centimeters (sccm) $C_2F_6$, 20 sccm $CH_3F$, and 60 sccm CO produces the desired results.

Figure 4:
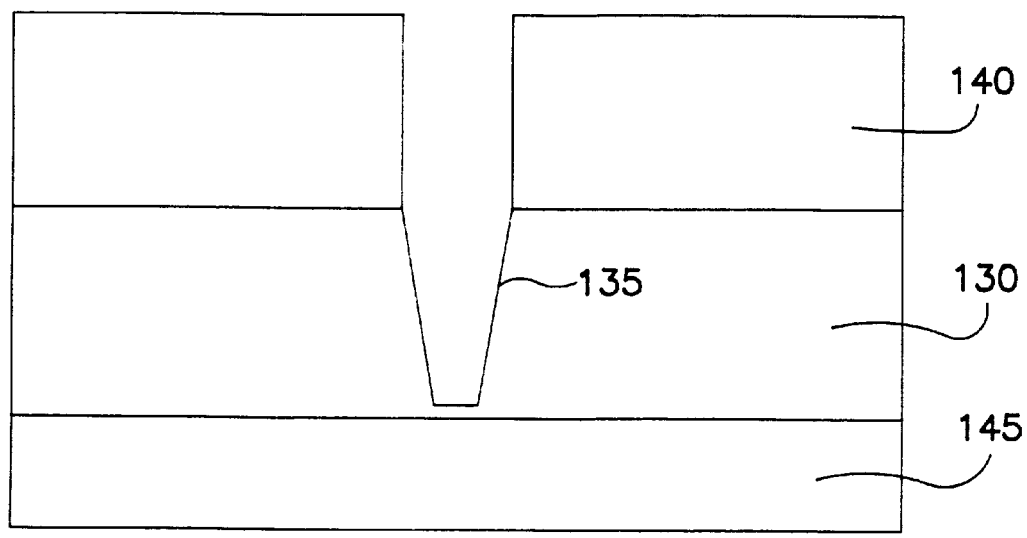
FIG. 4 shows a profile of a nitride etched using a further exemplary process in accordance with the present invention.

Increasing the polymerizing agent ($C_2F_6$) from 10 to 20 sccm with the other constituents constant, for example, increases the degree of taper 135 in the nitride layer 130, as shown in FIG. 4. The nitride layer 130 is positioned underneath an oxide or photoresist layer 140. The nitride layer 130 may be formed over a silicon substrate 145. The ability to carefully control taper angle in high aspect ratio nitride features enables easier fill of the holes during later processing.

Consistent with this mechanism, too little polymerizing agent ($C_2F_6$) leads to a more isotropic etch, although there also appears to be an additional ion enhanced component to the polymerizing agent based on the reduced etch rate (80 Å $s^{-1}$). The process of the present invention is applicable at 0.2 μm groundrules with aspect ratios greater than 6:1, and can be extended further.

Exemplary embodiments within the scope of the present invention include gas mixtures of 4%–20% $C_2F_6$, 10%–30% $CH_3F$, and 40%–70% CO. Further embodiments in accordance with the present invention include the application of fluorocarbon gas to produce downhole polymer (e.g., $CF_4$, $C_2F_6$, $C_3F_8$), a hydrogen source for enhancement of nitride etch rate with resist selectivity (e.g., $CH_2F_2$, $CH_3F$, dilute $H_2$ mixtures), and a weak oxidant for polymer clearing on the vertical surfaces (e.g., CO, $CO_2$, dilute $O_2$).

The process described herein was demonstrated on an Applied Materials High Density Plasma dry etch chamber, although other high density sources (e.g., Lam 9100) can be used.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A method for anisotropically etching a silicon nitride layer from a multilayer structure, said method comprising the steps of:
    exciting an etchant gas comprising a fluorocarbon gas, a hydrogen source, and a weak oxidant to form a high density plasma;
    applying a power source to said multilayer structure to control the directionality of said high density plasma on said multilayer structure; and
    introducing said high density plasma to said silicon nitride layer to etch said silicon nitride layer.

2. The method of claim 1, wherein said fluorocarbon gas is selected from the group consisting $CF_4$, $C_2F_6$, and $C_3F_8$.

3. The method of claim 1, wherein said hydrogen source is selected from the group consisting of $CH_2F_2$, $CH_3F$, and $H_2$.

4. The method of claim 1, wherein said weak oxidant is selected from the group consisting of CO, $CO_2$, and $O_2$.

5. The method of claim 1, wherein:
    said fluorocarbon gas is added in an amount of about 4–20% by volume;
    said hydrogen source is added in an amount of about 10–30% by volume; and
    said weak oxidant is added in an amount of about 40–70% by volume.

6. The method of claim 1, wherein:
    said fluorocarbon gas is $C_2F_6$;
    said hydrogen source is $CH_3F$; and
    said weak oxidant is CO.

7. The method of claim 1, wherein the step of exciting said etchant gas uses a coil, and said power source is decoupled from said coil.

8. The method of claim 1, wherein the step of exciting said etchant gas includes forming said high density plasma having a density of at least $10^{11}$ $cm^{-1}$.

9. The method of claim 1, further comprising the steps of:
    introducing said etchant gas into a chamber; and
    maintaining the pressure of said chamber at 1 to 20 millitorrs by utilizing a vacuum pump and coupling said vacuum pump to said chamber.

10. The method of claim 1, wherein the step of applying a power source comprises applying an RF power source to the side of said multilayer structure opposite said silicon nitride layer.

11. A method for anisotropically etching a silicon nitride layer from a multilayer structure, said method comprising the steps of:
    exciting an etchant gas comprising a fluorocarbon gas, a hydrogen source, and a weak oxidant by exposing said etchant gas to a first power source to form a high density plasma;
    applying a second power source, decoupled from said first power source, to said multilayer structure to control the directionality of said high density plasma on said multilayer structure; and
    introducing said high density plasma to said silicon nitride layer to etch said silicon nitride layer.

12. The method of claim 11, wherein:
    said fluorocarbon gas is $C_2F_6$;
    said hydrogen source is $CH_3F$; and
    said weak oxidant is CO.

13. A method for anisotropically etching a silicon nitride layer from a multilayer structure including said silicon nitride layer, a substrate, a silicon oxide layer, and a resist layer, said method comprising the steps of:
    introducing an etchant gas into a chamber, wherein said etchant gas comprises:
        (a) a fluorocarbon gas selected from the group consisting of $CF_4$, $C_2F_6$, and $C_3F_8$;
        (b) a hydrogen source selected from the group consisting of $CH_2F_2$, $CH_3F$, and $H_2$; and
        (c) a weak oxidant selected from the group consisting of CO, $CO_2$, and $O_2$;
    exciting said etchant gas by exposing said etchant gas to a first power source to form a high density plasma;
    controlling the bias of said high density plasma on said multilayer structure by applying a second power source, decoupled from said first power source, to said multilayer structure; and
    introducing said high density plasma to said silicon nitride layer to etch a feature in said silicon nitride layer having an aspect ratio of at least 2:1.

14. The method of claim 13, wherein:
    said fluorocarbon gas is $C_2F_6$;
    said hydrogen source is $CH_3F$; and
    said weak oxidant is CO.

15. The method of claim 13, wherein said feature has an aspect ratio of at least 6:1.

* * * * *

UNITED STATES PATENT AND TRADEMARK OFFICE
CERTIFICATE OF CORRECTION

PATENT NO.    : 6,051,504
DATED         : April 18, 2000
INVENTOR(S)   : Michael David Armacost et al.

Page 1 of 1

It is certified that error appears in the above-identified patent and that said Letters Patent is hereby corrected as shown below:

<u>Column 6,</u>
Claim 8, delete "$cm^{-1}$" insert -- $cm^{-3}$ --

Signed and Sealed this

Fourth Day of September, 2001

*Attest:*

NICHOLAS P. GODICI
*Attesting Officer*    *Acting Director of the United States Patent and Trademark Office*